United States Patent
Kim et al.

(10) Patent No.: US 10,839,900 B1
(45) Date of Patent: Nov. 17, 2020

(54) PARASITIC VOLTAGE DROP COMPENSATION IN LARGE CROSS-POINT ARRAYS

(71) Applicant: INTERNATIONAL BUSINESS MACHINES CORPORATION, Armonk, NY (US)

(72) Inventors: Seyoung Kim, White Plains, NY (US); Tayfun Gokmen, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/439,208

(22) Filed: Jun. 12, 2019

(51) Int. Cl.
*G11C 13/00* (2006.01)
*G06N 3/08* (2006.01)

(52) U.S. Cl.
CPC ........ *G11C 13/0038* (2013.01); *G11C 13/003* (2013.01); *G11C 13/0007* (2013.01); *G06N 3/08* (2013.01); *G11C 2213/32* (2013.01); *G11C 2213/79* (2013.01)

(58) Field of Classification Search
CPC ............ G11C 13/0038; G11C 13/0007; G11C 13/003
See application file for complete search history.

(56) References Cited

U.S. PATENT DOCUMENTS

| | | | |
|---|---|---|---|
| 6,259,644 B1 | 7/2001 | Tran et al. | |
| 6,894,938 B2 | 5/2005 | Smith et al. | |
| 8,305,793 B2 | 11/2012 | Majewski et al. | |
| 8,716,780 B2* | 5/2014 | Kellam | G11C 5/02 257/314 |
| 9,058,857 B2* | 6/2015 | Liu | G11C 13/0038 |
| 9,715,655 B2 | 7/2017 | Wu et al. | |
| 9,767,407 B2 | 9/2017 | Cho et al. | |
| 9,966,127 B2 | 5/2018 | Bedeschi et al. | |
| 10,043,855 B1* | 8/2018 | Agarwal | H01L 27/2463 |
| 2007/0233761 A1 | 10/2007 | Mouttet | |
| 2017/0109626 A1 | 4/2017 | Gokmen et al. | |
| 2017/0125483 A1* | 5/2017 | Tanaka | H01L 45/1253 |
| 2018/0005110 A1 | 1/2018 | Gokmen et al. | |

(Continued)

FOREIGN PATENT DOCUMENTS

WO WO 2014/175896 A1 10/2014

OTHER PUBLICATIONS

Gokmen et al., "Acceleration of Deep Neural Network Training with Resistive Cross-Point Devices: Design Considerations", Frontiers in Neuroscience, Jul. 2016, pp. 1-13.

(Continued)

*Primary Examiner* — Tri M Hoang
(74) *Attorney, Agent, or Firm* — Tutunjian & Bitetto, P.C.; Randall Bluestone (57) ABSTRACT

A cross-point array and method for forming the same are provided. The cross-point array includes an array of Resistive Processing Unit (RPU) devices having rows and columns interconnected at cross-points. The cross-point array further includes a plurality of series resistors. Each respective one of the plurality of series resistors has a first end connected in series with a respective one of the RPU devices and a second end connected to a respective one of the cross-points to compensate for a parasitic voltage drop associated with each of the RPU devices.

19 Claims, 10 Drawing Sheets

(56) References Cited

U.S. PATENT DOCUMENTS

2018/0225567 A1   8/2018  Bedell et al.
2018/0253642 A1   9/2018  Gokmen et al.
2018/0293209 A1  10/2018  Gokmen et al.

OTHER PUBLICATIONS

Gokmen et al., Training Deep Convolutional Neural Networks with Resistive Cross-Point Devices, Frontiers in Neuroscience, Oct. 2017, pp. 1-13.
Haensch et al., "The Next Generation of Deep Learning Hardware: Analog Computing", Proceedings of the IEEE, Jan. 2019, pp. 108-122, vol. 107, No. 1.
Krestinskaya et al., "Learning in Memristive Neural Network Architectures using Analog Backpropagation Circuitsar", Xiv:1808.10631v1 [cs.ET] Aug. 31, 2018, pp. 1-14.
Solomon, Paul M., "Analog Neuromorphic Computing using Programmable Resistor Arrays", Solid-State Electronics, Mar. 2019, 33 pages.

\* cited by examiner

PARASITIC VOLTAGE DROP COMPENSATION IN LARGE CROSS-POINT ARRAYS

BACKGROUND

The present invention generally relates to machine learning, and more particularly to parasitic voltage drop compensation in large cross-point arrays.

Given the detrimental existence of parasitic voltage drop in large cross-point arrays, there is a need for parasitic voltage drop compensation in large cross point arrays.

SUMMARY

According to an aspect of the present invention, a cross-point array is provided. The cross-point array includes an array of Resistive Processing Unit (RPU) devices having rows and columns interconnected at cross-points. The cross-point array further includes a plurality of series resistors. Each respective one of the plurality of series resistors has a first end connected in series with a respective one of the RPU devices and a second end connected to a respective one of the cross-points to compensate for a parasitic voltage drop associated with each of the RPU devices.

According to another aspect of the present invention, a method of forming a cross-point array is provided. The method includes forming an array of Resistive Processing Unit (RPU) devices having rows and columns interconnected at cross-points. The method further includes forming a plurality of series resistors. Each respective one of the plurality of series resistors has a first end connected in series with a respective one of the RPU devices and a second end connected to a respective one of the cross-points to compensate for a parasitic voltage drop associated with each of the RPU devices.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to parasitic voltage drop compensation in large cross point arrays.

Figure 1:
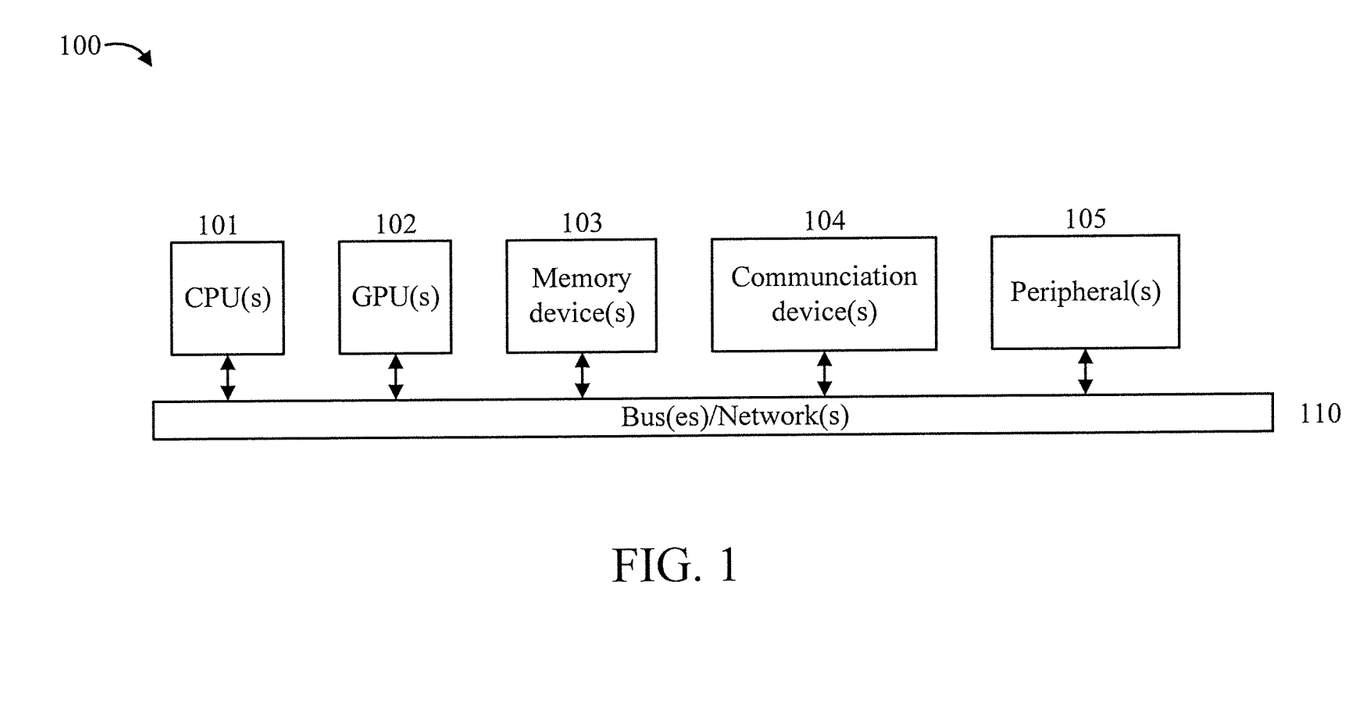
FIG. 1 is a block diagram showing an exemplary processing system to which the present invention may be applied, in accordance with an embodiment of the present invention.

FIG. 1 is a block diagram showing an exemplary processing system 100 to which the present invention may be applied, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, an imaging device, and so forth. Elements of processing system 100 are connected by one or more buses or networks (collectively denoted by the figure reference numeral 110).

In an embodiment, memory devices 103 can store specially programmed software modules in order to transform the computer processing system into a special purpose computer configured to implement various aspects of the present invention. In an embodiment, special purpose hardware (e.g., Application Specific Integrated Circuits, and so forth) can be used to implement various aspects of the present invention.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

Figure 2:
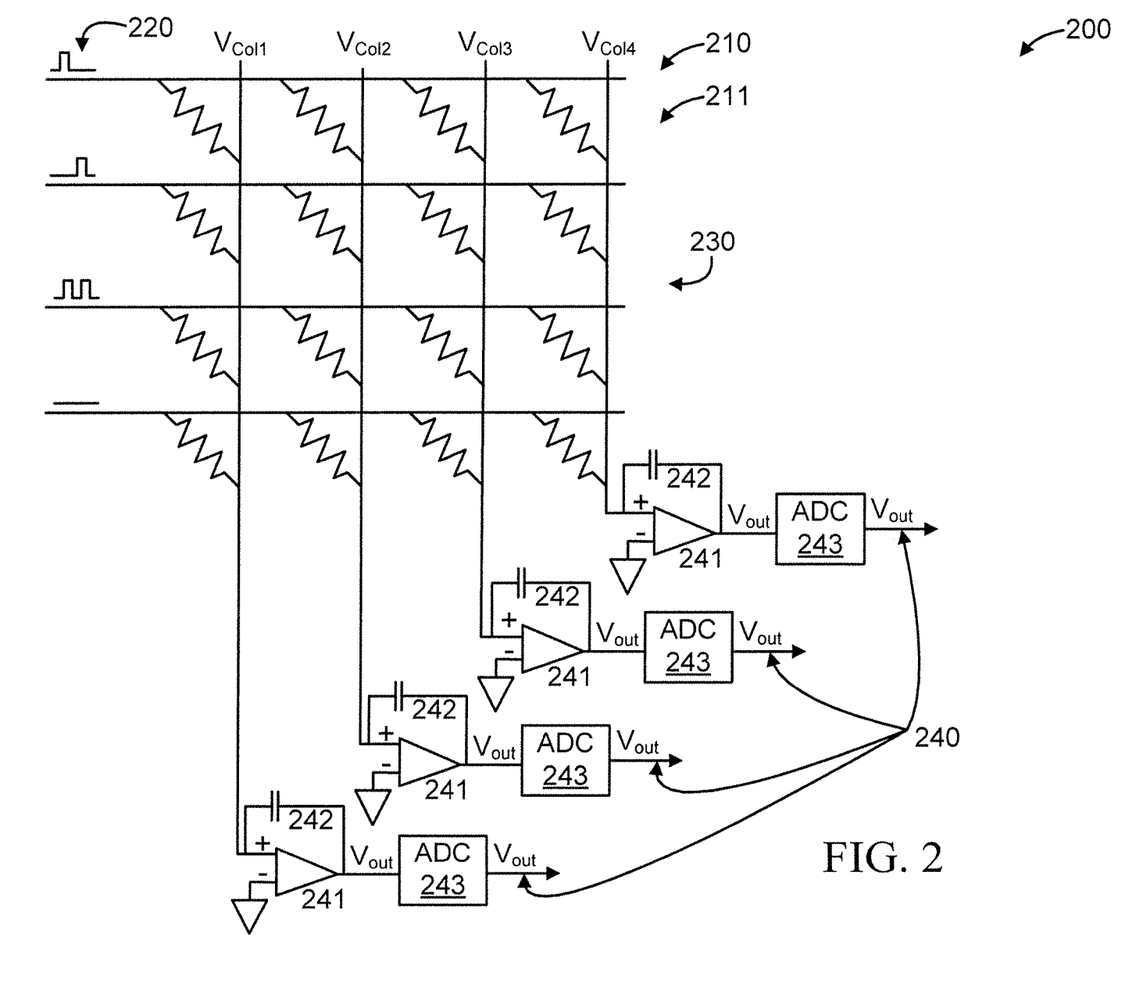
FIG. 2 is a block diagram showing an exemplary Resistive Processing Unit-based (RPU-based) neural network training accelerator to which the present invention can be applied, in accordance with an embodiment of the present invention.

FIG. 2 is a block diagram showing an exemplary Resistive Processing Unit-based (RPU-based) neural network training accelerator 200 to which the present invention can be applied, in accordance with an embodiment of the present invention. The accelerator is used to accelerate training of a neural network such as, for example, a deep neural network.

A cross-point array 210 with RPU devices 211 can be used as an analog-vector-matrix multiplier. Training of the cross-point array 210 involves forward, backward propagation and a weight update operation. The input vector is a voltage pulse 220 in each row. A weight matrix 230 is represented by the respective conductance of the resistive devices. An output vector 240 can be obtained from the current in each column, e.g., using a respective current integrator 241 and a respective Analog-to-Digital Converter (ADC) 243 coupled to each of the four columns of the cross-point array. In particular, the ADC is connected to an output of the current integrator 241 in order to output a digital value from an integrated analog input. A respective capacitor 242 is connected across one (the non-inverting) of the input terminals and an output terminal of each current integrator 241. The other (inverting) input terminal of the current integrator 241 is connected to ground.

Using the cross-point array 210, large vector-matrix multiplication can be computed in a single time step (O(1)). The RPU-based accelerator 200 has a significantly improved power efficiency and acceleration compared to a CPU or GPU.

The finite wire resistance reduces the applied voltages at the cross-point deep in the array as the array size increases.

The voltage drop in the cross-point array fundamentally limits the array size applicable in a given RPU application.

Due to the voltage drop issue, a RPU array requires a high resistance cross-point device which is difficult to achieve.

Figure 3:
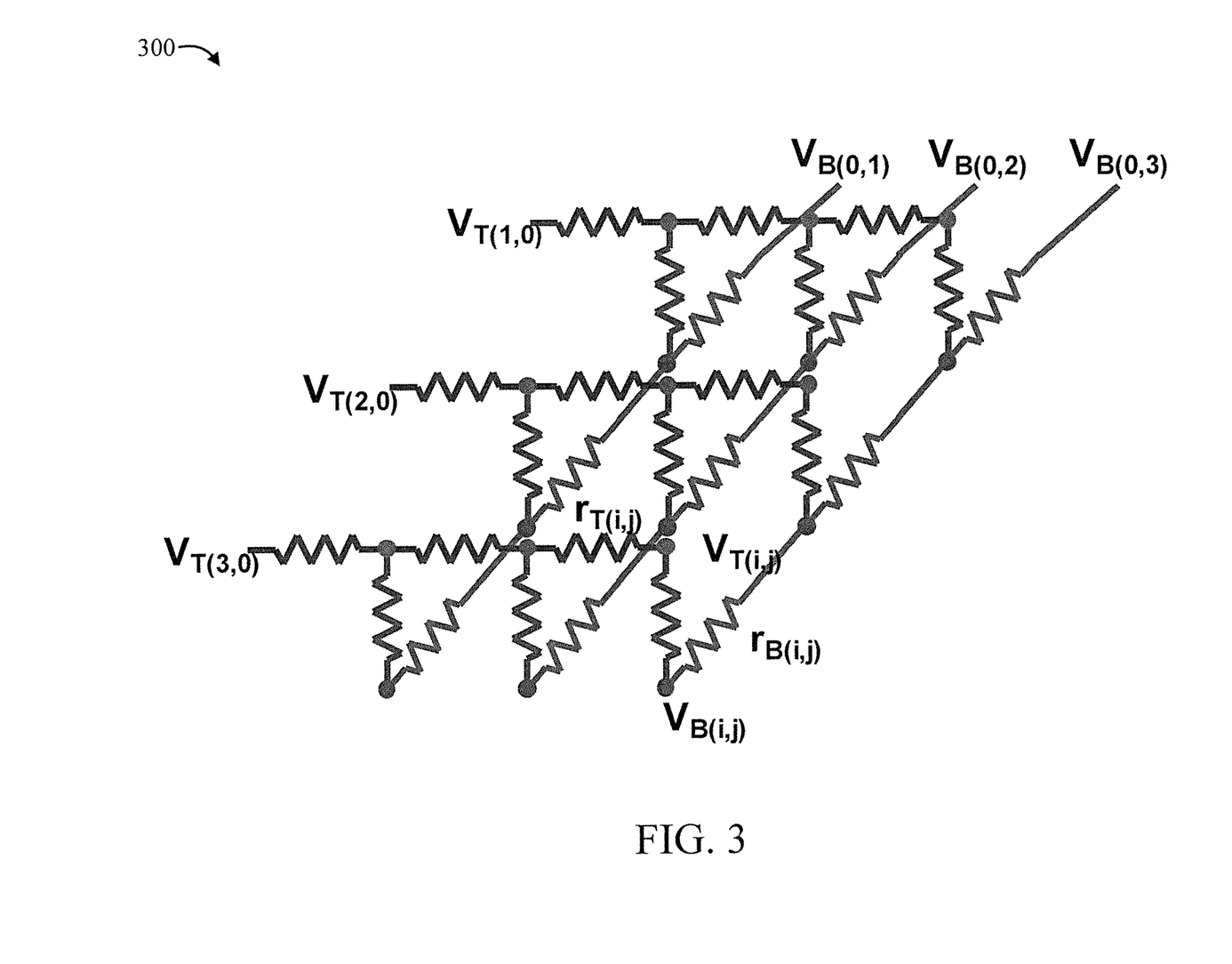
FIG. 3 is a diagram showing voltage drop in a cross-point array, to which the present invention can be applied, in accordance with an embodiment of the present invention.

FIG. 3 is a diagram showing voltage drop 300 in a cross-point array, to which the present invention can be applied, in accordance with an embodiment of the present invention.

Kirchoff's Current Law (KCL) at a top node is calculated as follows:

$$\frac{V_{T(i,j-1)} - V_{T(i,j)}}{r_T(i, j)} + \frac{V_{B(i,j)} - V_{T(i,j)}}{R(i, j)} + \frac{V_{T(i,j)} - V_{T(i,j)}}{r_T(i, j+1)} = 0,$$

where R denotes a device resistance, and r denotes a line resistance between cross-point devices.

KCL at a bottom node is calculated as follows:

$$\frac{V_{B(i-1,j)} - V_{B(i,j)}}{r_B(i, j)} + \frac{V_{T(i,j)} - V_{B(i,j)}}{R(i, j)} + \frac{V_{B(i+1,j)} - V_{B(i,j)}}{r_{B(i+1,j)}} = 0.$$

In order to compensate for this unwanted voltage drop, a voltage drop compensation technique is introduced that determines compensation resistance values and that, in turn, introduces a respective Rs per x-point. That is, to allow a similar amount of voltage drop at each cross-point element, an intentional series resistance device Rs per cross-point is introduced. The inserted Rs at the cross-points corresponds to the worst-case voltage drop.

Figure 4:
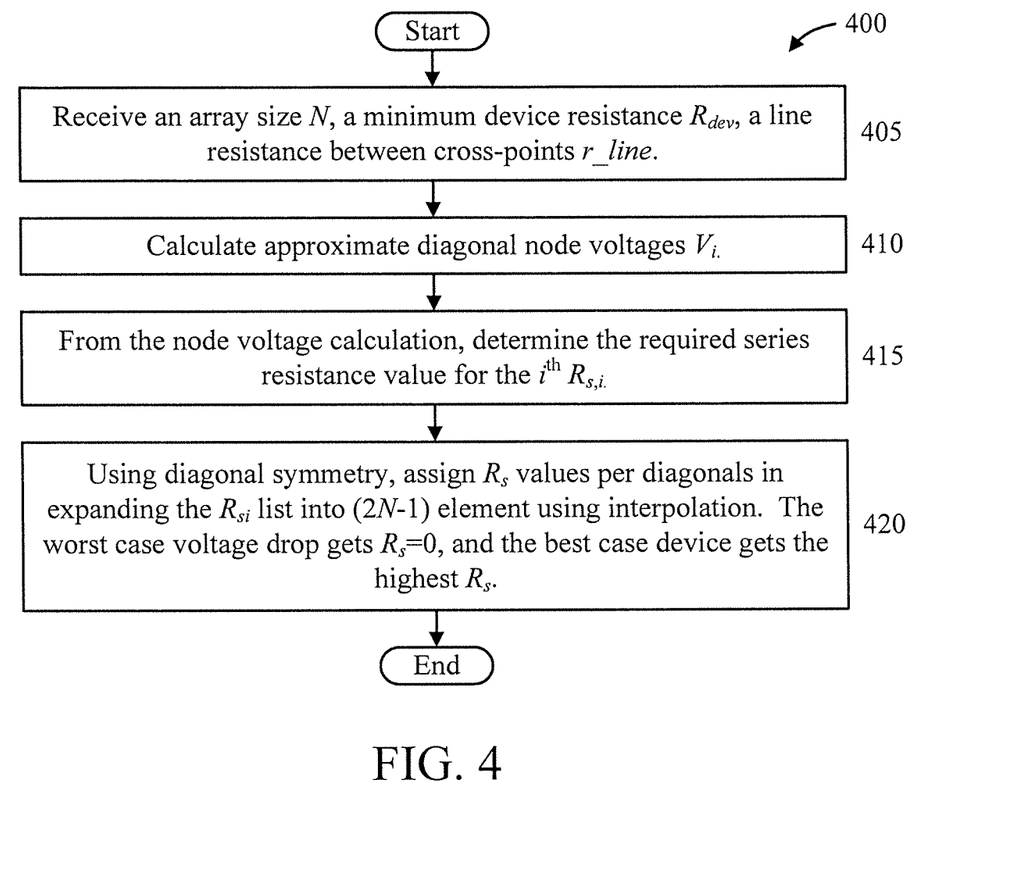
FIG. 4 is a flow diagram showing an exemplary analytical method for calculating $R_s$ values, in accordance with an embodiment of the present invention.

FIG. 4 is a flow diagram showing an exemplary analytical method 400 for calculating $R_s$ values, in accordance with an embodiment of the present invention.

At block 405, receive an array size N, a minimum device resistance $R_{dev}$ (aka "R" in short), a line resistance r_line (aka "r" in short") between cross-points.

At block 410, calculate approximate diagonal node voltages $V_i$ as follows:

$$\frac{V_i}{V} = 1 - \frac{r}{R}(N - i + 1)(N + i),$$

where V is the applied voltage.

At block 415, from the node voltage calculation, determine the required series resistance value for the $i^{th}$ $R_{s,i}$ as follows:

$$\frac{R_{si}}{R} = \frac{1 - \frac{r}{R}(N - i + 1)(N + i)}{1 - \frac{r}{R}N(N + 1)} - 1.$$

At block 420, using diagonal symmetry, assign $R_s$ values per diagonals in expanding the $R_{si}$ list into (2N−1) element using interpolation. The worst case voltage drop gets $R_s$=0, and the best case device gets the highest $R_s$.

Figure 5:
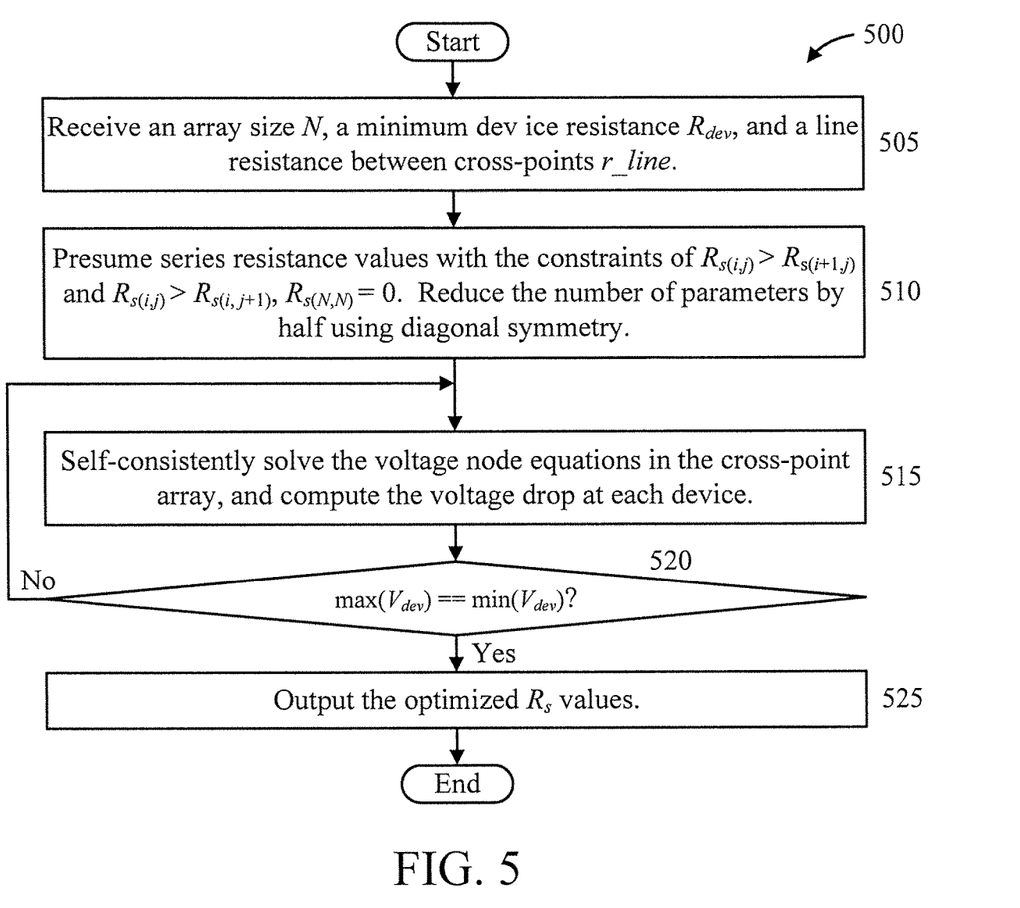
FIG. 5 is a flow diagram showing an exemplary numerical method for calculating $R_s$ values, in accordance with an embodiment of the present invention.

FIG. 5 is a flow diagram showing an exemplary numerical method 500 for calculating $R_s$ values, in accordance with an embodiment of the present invention.

At block 505, receive an array size N, a minimum device resistance $R_{dev}$, a line resistance r_line (aka "r" in short") between cross-points.

At block 510, presume series resistance values with the constraints of $R_{s(i,j)} > R_{s(i+1,j)}$ and $R_{s(i,j)} > R_{s(i,j+1)}$, $R_{s(N,N)}$=0. Reduce the number of parameters by half using diagonal symmetry.

At block 515, self-consistently solve the voltage node equations in the cross-point array, and compute the voltage drop at each device.

At block 520, determine whether max($V_{dev}$)==min($V_{dev}$). If so, then proceed to block 525. Otherwise, return to block 515.

At block 525, output the optimized $R_s$ values.

Figure 6:
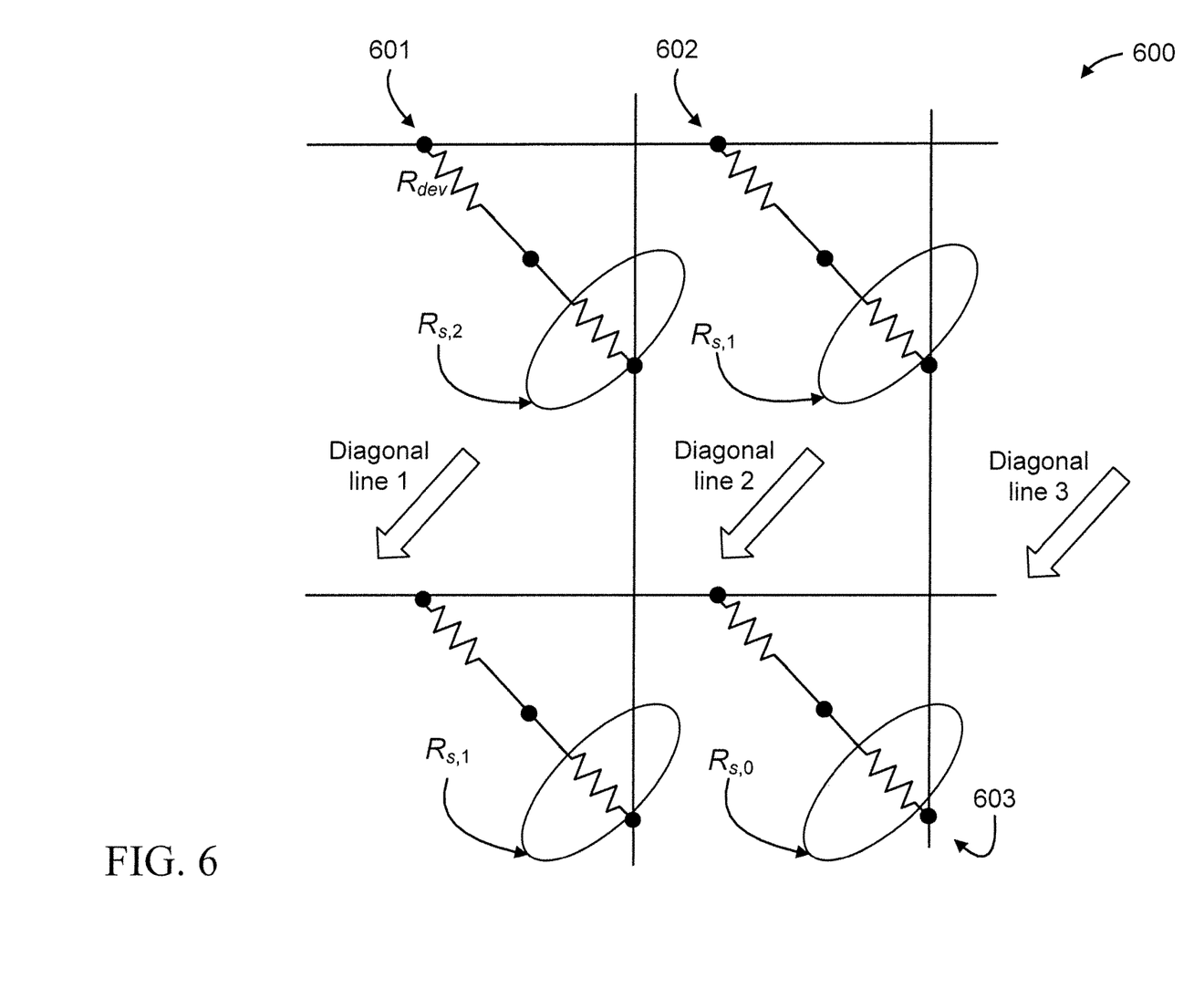
FIG. 6 is a diagram showing an exemplary 2×2 matrix case to which the present invention can be applied, in accordance with an embodiment of the present invention.

FIG. 6 is a diagram showing an exemplary 2×2 matrix case 600 to which the present invention can be applied, in accordance with an embodiment of the present invention.

$R_{s,2}$ is calculated for a set 601 of diagonal resistors along diagonal line 1. $R_{s,1}$ is calculated for a set 602 of diagonal resistors along diagonal line 2. $R_{s,0}$ is calculated for a set 603 of diagonal resistors along diagonal line 3. As used herein, the term "diagonal resistors" means (non-$R_{dev}$) resistors on a same diagonal line.

Thus, as a solution, the present invention inserts Rs at the cross-point with respect to the worst-case voltage drop. To allow the similar amount of voltage drop at each cross-point element, the present invention introduces an intentional series resistance device per cross-point. By setting up the series resistance value based on the voltage drop due to the parasitic resistances to the cross-point, the parasitic voltage drop issue in the resistive cross-point array can be solved.

Figure 7:
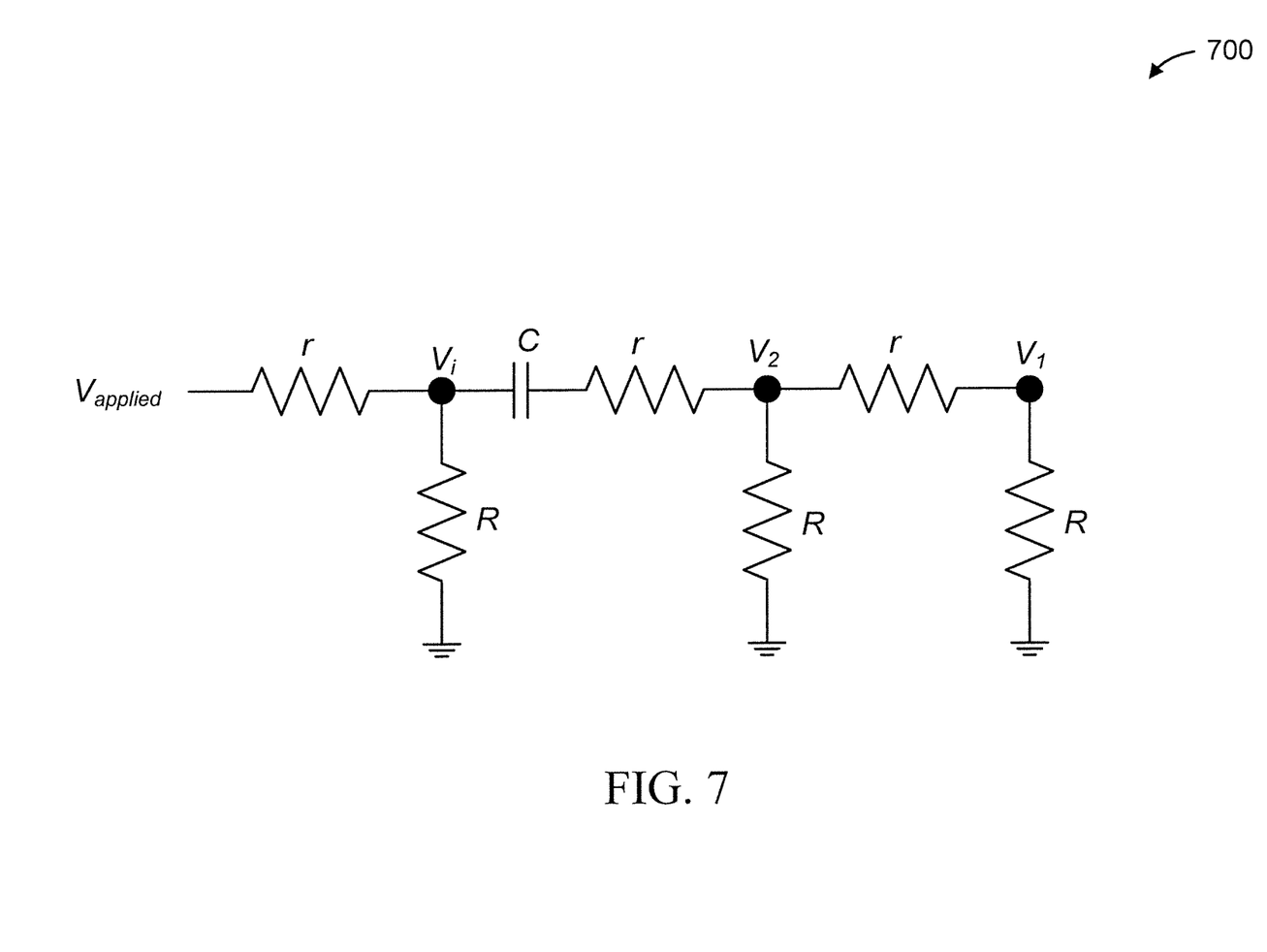
FIG. 7 is a diagram showing a circuit portion model to which the present invention can be applied, in accordance with an embodiment of the present invention.
Figure 8:
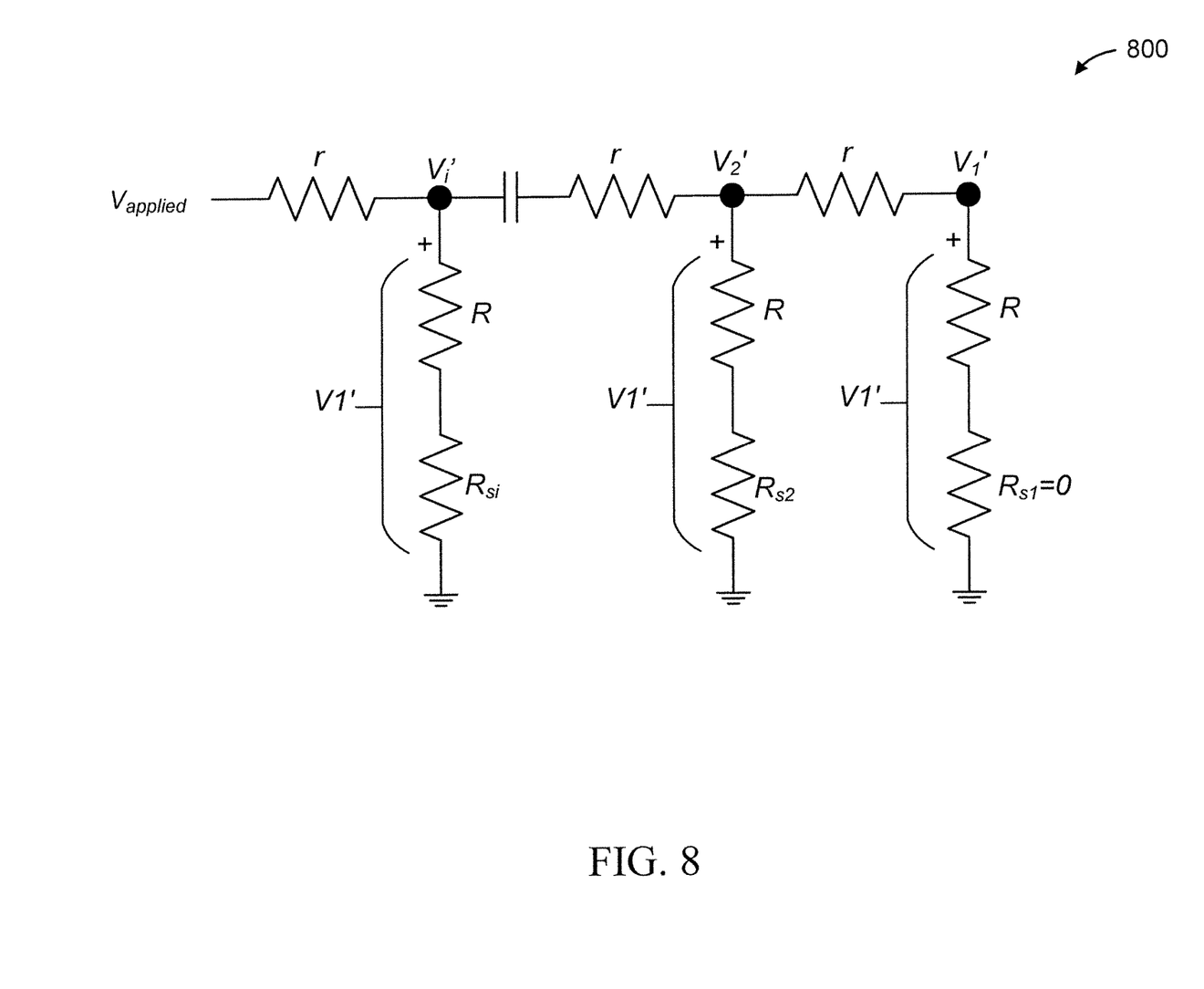
FIG. 8 is a diagram showing an exemplary modified circuit portion model that includes intentionally introduced series resistance devices $R_s$ per cross-point, in accordance with an embodiment of the present invention.

FIG. 7 is a diagram showing a circuit portion model 700 to which the present invention can be applied, in accordance with an embodiment of the present invention. FIG. 8 is a diagram showing an exemplary modified circuit portion model 800 that includes intentionally introduced series resistance devices $R_s$ per cross-point, in accordance with an embodiment of the present invention.

The circuit models 700 and 800 commonly include lines resistances r, device resistances $R_{dev}$ and a capacitor C. Different from circuit portion model 700, modified circuit portion model 800 includes series resistances $R_{s1}$, $R_{s2}$, $R_{si}$.

Regarding modified circuit portion model 800, the following applies:

$$\frac{v_i}{v} = 1 - \frac{r}{R}(N - i + 1)(N + i), \text{ and}$$

$$\frac{R_{si}}{R} = \frac{1 - \frac{r}{R}(N - i + 1)(N + i)}{1 - \frac{r}{R}N(N + 1)} - 1.$$

The required series resistance values of series resistances $R_{s1}$, $R_{s2}$, $R_{si}$ can be calculated/simulated, and corresponding series resistance value can be built into the array to fix the issue. In the case of FIG. 8, $R_{s1}$ is equal to zero, the voltage drop across each of $(R+R_{s1})$, $(R+R_{s2})$, and $(R+R_{si})$ is equal to $V_1'$. In the case of FIG. 8, $R_{s1} < R_{s2} < R_{si}$. This is because the voltage drop decreases the further from $V_{applied}$.

A description will now be given regarding various methods for parasitic voltage drop compensation in a large cross-point array, in accordance with various embodiments of the present invention.

One approach can involve building a fixed value resistor at each cross-point with the precise resistance calculation based on the minimum resistance of the cross-point device. The resistance values can be set/tuned by controlling the size of the resistor structure For example, in an embodiment, narrow wire resistors with area/width/length control can be used (tuned) to achieve a certain resistance value(s). Thus, for example, the area, width, and/or length of the resistors can be controlled to control the corresponding resistance value provided by such resistors, thus provided area-type, width-type, and/or length-type resistance control, respectively. In an embodiment, the resistance of Poly-Si, or oxides such as WOx can be used to achieve and/or otherwise form resistors with a certain resistance value(s). In an embodiment, resistive vias with dimension control can be used to achieve a certain resistance value(s). For example, length, diameter, wall thickness, and other dimensions of the vias can be used (controlled) to achieve a certain resistance value(s).

Figure 9:
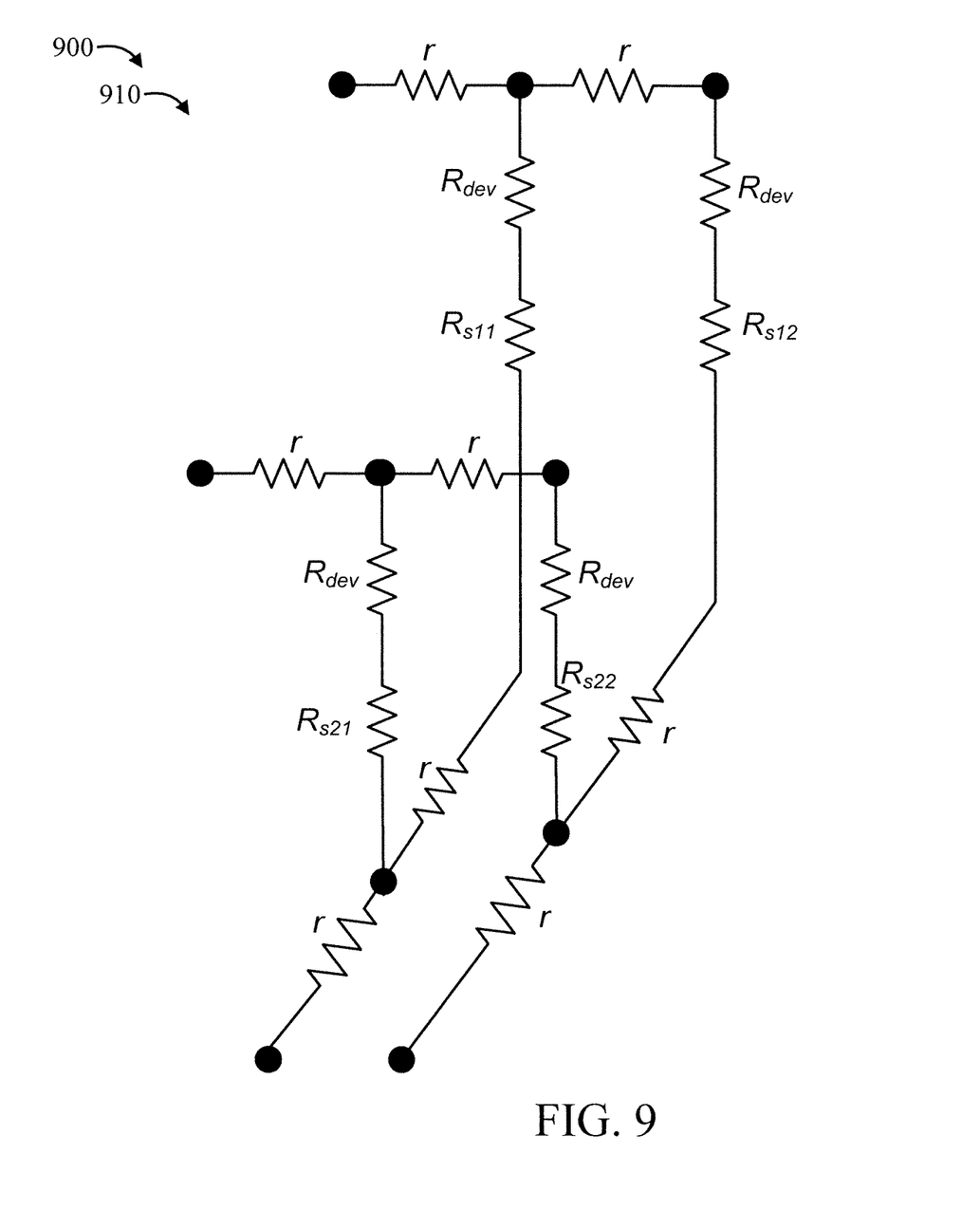
FIG. 9 is a diagram showing an exemplary cross-point array with parasitic voltage drop compensation using passive resistance elements, in accordance with an embodiment of the present invention.

FIG. 9 is a diagram showing an exemplary cross-point array 900 with parasitic voltage drop compensation using passive resistance elements 910, in accordance with an embodiment of the present invention.

In cross-point array 900, resistors $R_{s11}$, $R_{s12}$, $R_{s21}$, and $R_{s22}$ are used as passive resistance elements 910 to compensate for parasitic voltage drop.

Another approach involves implementing the series resistance elements with active circuit elements. For example, a FET or other transistor type having gate control can be used as an active resistance to solve the voltage drop issue. Hence, varying the gate voltage can vary the corresponding resistance of the FETs in order to achieve a particular resistance value.

Figure 10:
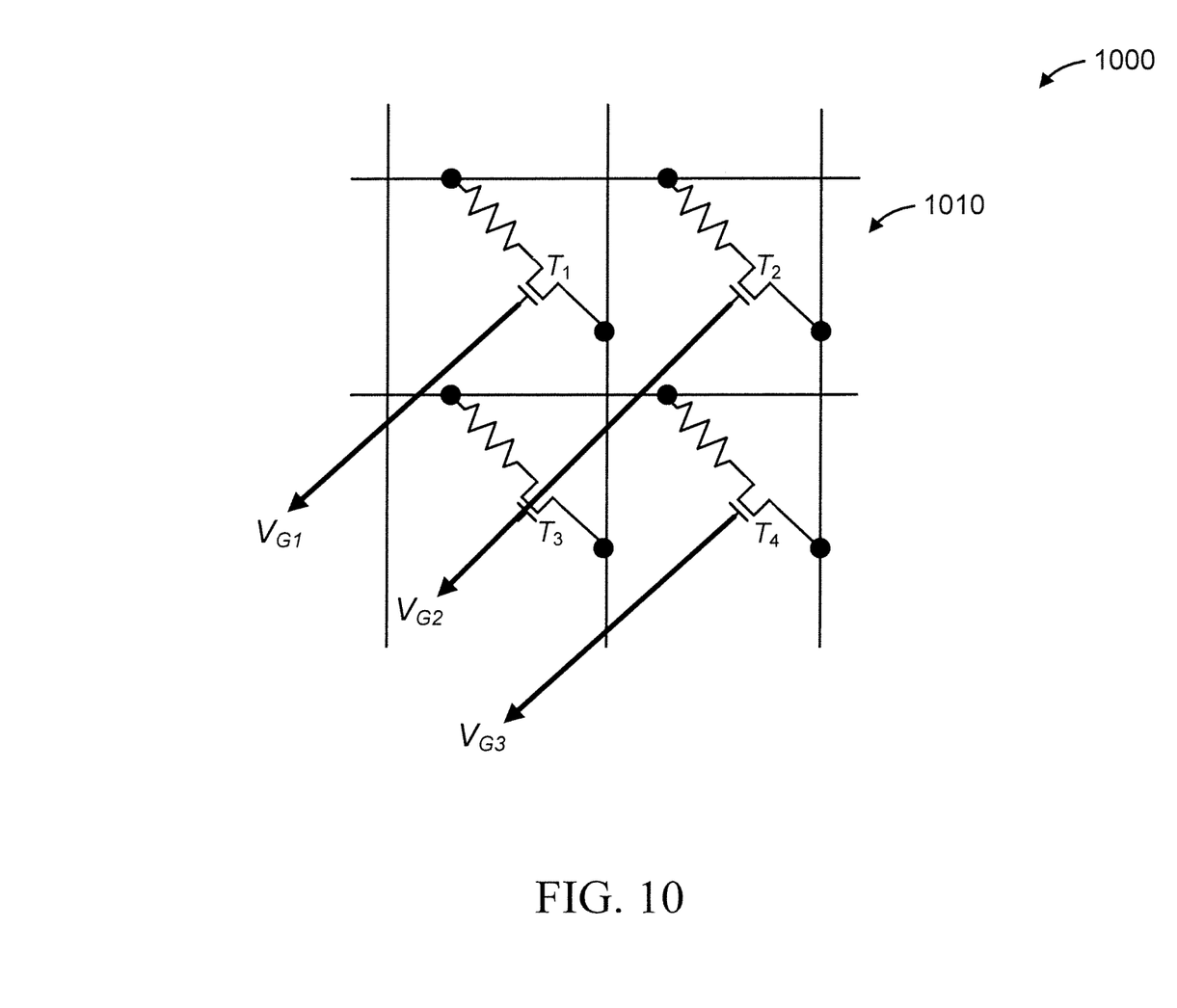
FIG. 10 is a diagram showing another exemplary cross-point array with parasitic voltage drop compensation using active resistance elements, in accordance with an embodiment of the present invention.

FIG. 10 is a diagram showing another exemplary cross-point array 1000 with parasitic voltage drop compensation using active resistance elements 1010, in accordance with an embodiment of the present invention.

In cross-point array 1000, transistors $T_1$, $T_2$, $T_3$ and $T_4$ are used as active resistance elements 1010 to compensate for parasitic voltage drop. Resistance values of the transistors $T_1$, ($T_2$, $T_3$) and $T_4$ can be controlled by respective gate voltages $V_{G1}$, ($V_{G2}$), and $V_{G3}$.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A cross-point array, comprising:
an array of Resistive Processing Unit (RPU) devices having rows and columns interconnected at cross-points; and
a plurality of series resistors, each respective one of the plurality of series resistors having a first end connected in series with a respective one of the RPU devices and a second end connected to a respective one of the cross-points to compensate for a parasitic voltage drop associated with each of the RPU devices,
wherein a particular one of the plurality of series resistors connected to a particular one of the RPU devices having a highest voltage drop from among the RPU devices is assigned a resistance value of zero, and wherein another one of the plurality of series resistors connected to another one of the RPU devices having a lowest voltage drop from among the RPU devices is assigned a highest resistor value from a list of potential values determining using interpolation.

2. The cross-point array of claim 1, wherein a respective value of each of the plurality of series resistors is selected so as to produce a same voltage drop between the cross-points of the array.

3. The cross-point array of claim 1, wherein a respective value of each given resistor from among the plurality of series resistors is selected based on a worst-case voltage drop expected at the corresponding one of the cross-points to which the given resistor is connected.

4. The cross-point array of claim 1, wherein a respective value of each given resistor from among the plurality of series resistors is selected based on a minimum possible resistance of the respective one of the RPU devices to which the given resistor is connected.

5. The cross-point array of claim 1, wherein a respective value of each given resistor from among the plurality of series resistors is selected using a diagonal symmetry approach that assigns a same resistance value to respective ones of the plurality of series resistors situated along a same diagonal line taken across the cross-point array.

6. The cross-point array of claim 1, wherein a resistance of each of the plurality of series resistors is set using a control type selected from the group consisting of an area-type resistance control, a width-type resistance control, and a length-type resistance control.

7. The cross-point array of claim 1, wherein a resistance of each of the plurality of series resistors is set using an oxide.

8. The cross-point array of claim 1, wherein a resistance of each of the plurality of series resistors is set using dimension control on a set of resistive vias.

9. The cross-point array of claim 1, wherein the plurality of series resistors are implemented by active elements, wherein a gate voltage control operation is performed on the active elements to adjust a resistance of each of the active elements.

10. The cross-point array of claim 9, wherein the active elements comprise field effect transistors.

11. The cross-point array of claim 1, wherein values for the plurality of series resistors are selected under a constraint that the values decrement for each subsequent one of the plurality of series resistors in a given row and a given column with respect to a voltage source.

12. A method of forming a cross-point array, comprising:
   forming an array of Resistive Processing Unit (RPU) devices having rows and columns interconnected at cross-points; and
   forming a plurality of series resistors, each respective one of the plurality of series resistors having a first end connected in series with a respective one of the RPU devices and a second end connected to a respective one of the cross-points to compensate for a parasitic voltage drop associated with each of the RPU devices,
   wherein a particular one of the plurality of series resistors connected to a particular one of the RPU devices having a highest voltage drop from among the RPU devices is assigned a resistance value of zero, and wherein another one of the plurality of series resistors connected to another one of the RPU devices having a lowest voltage drop from among the RPU devices is assigned a highest resistor value from a list of potential values determining using interpolation.

13. The cross-point array of claim 12, further comprising selecting a respective value of each of the plurality of series resistors so as to produce a same voltage drop between the cross-points of the array.

14. The cross-point array of claim 12, further comprising selecting a respective value of each given resistor from among the plurality of series resistors based on a worst-case voltage drop expected at the corresponding one of the cross-points to which the given resistor is connected.

15. The cross-point array of claim 12, further comprising selecting a respective value of each given resistor from among the plurality of series resistors based on a minimum possible resistance of the respective one of the RPU devices to which the given resistor is connected.

16. The cross-point array of claim 12, further comprising selecting a respective value of each given resistor from among the plurality of series resistors using a diagonal symmetry approach that assigns a same resistance value to respective ones of the plurality of series resistors situated along a same diagonal line taken across the cross-point array.

17. The cross-point array of claim 12, further comprising setting a resistance of each of the plurality of series resistors using a control type selected from the group consisting of an area-type resistance control, a width-type resistance control, and a length-type resistance control.

18. The cross-point array of claim 12, further comprising setting a resistance of each of the plurality of series resistors using an oxide.

19. The cross-point array of claim 12, further comprising setting a resistance of each of the plurality of series resistors using dimension control on a set of resistive vias.

* * * * *